(12) United States Patent
Mueller

(10) Patent No.: US 6,915,318 B2
(45) Date of Patent: Jul. 5, 2005

(54) INTERPOLATOR

(75) Inventor: Detlef Mueller, Renningen (DE)

(73) Assignee: LSI Logic Corporation, Milpitas, CA (US)

( * ) Notice: Subject to any disclaimer, the term of this patent is extended or adjusted under 35 U.S.C. 154(b) by 624 days.

(21) Appl. No.: 10/134,741

(22) Filed: Apr. 29, 2002

(65) Prior Publication Data
US 2003/0204542 A1 Oct. 30, 2003

(51) Int. Cl.$^7$ .............................................. G06F 17/17
(52) U.S. Cl. ...................................................... 708/290
(58) Field of Search ......................................... 708/290

(56) References Cited

U.S. PATENT DOCUMENTS 5,844,139 A * 12/1998 Miller et al. .................. 73/602
6,144,712 A * 11/2000 Samueli et al. ............. 375/371
6,307,900 B1 * 10/2001 Choi ........................... 375/341

* cited by examiner

Primary Examiner—D. H. Malzahn
(74) Attorney, Agent, or Firm—Christopher P. Maiorana PC

(57) ABSTRACT

A signal interpolator comprises a fractional interpolator and a numeric controlled oscillator. The numeric controlled oscillator may generate a control signal for controlling the fractional interpolator. The numeric controlled oscillator generally comprises a register, a modulo-M device, and an adder. The register may hold a count value, and the modulo-M device may apply a modulo-M function to the count value to generate the control signal therefrom. The adder may add an increment value to the modulo-M signal from the modulo-M device, to update the count value in the register.

21 Claims, 4 Drawing Sheets ated in both Time Division Synchronous Code Division
INTERPOLATOR

FIELD OF THE INVENTION

The present invention relates to a signal interpolator, in particular, using fractional interpolation, for example, to enable processing of a first signal based on a first clock rate, by circuitry operating at a second clock rate. The invention is especially, but not exclusively, suitable to be implemented in an integrated circuit.

A particular application of the invention is in the field of mobile telecommunications, for a processor capable of operMultiple Access (TD-SCDMA) and Global System Mobile (GSM) modes, these modes relying on different, incompatible clock frequencies. Another application is the field of signal encoders, for example, quadrature amplitude modulation (QAM) encoders. However, the invention is not limited exclusively to such applications.

BACKGROUND TO THE INVENTION

It is desirable that TD-SCDMA systems support GSM as well as the new TD-SCDMA standard. However, there is an inherent incompatibility in the signal timings for the two standards. Conventional GSM systems have an inherent timing which is derived from 13 MHz clock oscillator. In contrast, conventional TD-SCDMA systems have a symbol and chip-rate derived from a 10.24 MHz clock. (From a conceptual point of view, the processing of transmit and receive signals can be done at n-times the chip rate. For simple implementations, usually small values of n are used, of about not greater than 10 (i.e., 2, 4 or 8). Therefore, it is common to require small integer values times the above frequencies).

It is not practical to use a single Phase Locked Loop (PLL) for generating both of the above frequencies, as it would have to operate at a common divisor of the two frequencies, the desired frequency being generated by varying the multiplication factor inside the PLL. However, for the above frequencies, the highest common divisor is only 40 KHz. This requires an extremely large multiplication factor inside the PLL. For example, the frequency multiplication factor from 40 KHz to 10.24 MHz is 256. If a multiple of 10.24 MHz is desired, then the multiplication factor would have to be even higher, for example, 1024 for 4×10.24 MHz. Such high multiplication factors make the output frequency from the PLL very unstable. Moreover, a PLL with such a high multiplication factor is extremely difficult to implement in an integrated circuit due to noise and isolation problems.

An alternative type of clock system is one using digital interpolation. FIGS. 1 and 2 show schematically the principles of a conventional digital interpolator 10, for clock extraction of an input signal 12 having an input clock rate Fi, using circuitry which is clocked at circuit clock frequency Fc different from the desired frequency Fi. The principle of operation is that, although the circuitry operates at the circuit clock frequency Fc, the samples are manipulated numerically or mathematically as if the circuit were operating at a hypothetical clock frequency of Fi. In more detail, the input signal 12 is sampled at the circuit clock frequency Fc by an analog-to-digital converter (ADC) 14, which produces output samples (i.e., $a_{i-1} \ldots a_{i+2}$) related to the timing Fc. The output from the ADC 14 is fed to a fractional interpolator 16 which re-calculates (interpolates) the samples at timings (b) controlled by a numeric controlled oscillator (NCO) 18. The NCO 18 includes an m-bit accumulator 20 and an m-bit adder 22 which is coupled in a feedback-loop to increment the value in the accumulator 20 by an integer value (i.e., STEP) held in a register 24. The NCO 18 is clocked at the clock frequency Fc, so that the accumulator is repeatedly incremented by the value STEP at the clock rate Fc.

The values $2^m$ and STEP govern the rate and timings of new (interpolated) samples by the fractional interpolator 16, relative to the circuit clock frequency Fc. Each time the adder 22 overflows, an overflow output 26 signals that a "cycle" of the interpolated signal (based on Fi) has been completed, for controlling downstream processing circuitry (not shown). Therefore, the circuit can handle a signal based on a timing of Fi, even though the circuit is being clocked by a different frequency Fc.

However, such an NCO is only capable of generating accurate timings for frequency relationships which can be related by $2^m$ and STEP. The repetition frequency $F_{NCO}$ for the NCO 18 is given by equation 1 as follows:

$$F_{NCO} = Fc \times STEP/2^m \qquad \text{Eq.(1)}$$

For the frequencies of 13 MHz and 10.24 MHz (or low multiples thereof) mentioned above for GSM and TD-SCDMA, it is impossible to find values of m and STEP which can satisfy the above relationship. Therefore, it is not possible to use the fractional interpolator 16 and the NCO 18 to generate the desired frequencies accurately. To address this incompatibility, an error responsive control signal 28 can be fed back from the downstream circuitry for varying the value STEP dynamically in response to detected error rates, so that the interpolated frequency approximates the desired input frequency Fi. However, such a circuit inherently has a significant degree of jitter, and relies on an error responsive control signal to dynamically "correct" the incorrect timings from the NCO.

FIG. 3 shows a conventional approach to Quadrature Amplitude Modulation (QAM). The conventional QAM modulator comprises an encoder circuitry 100 which receives data at an input rate (i.e., Fi), and outputs data at a higher output rate (i.e., Fo). Among other circuitry, the encoder circuitry 100 includes a forward error correction (FEC) block 102 which increases the redundancy of N bytes of data to N+R bytes, a symbol mapper 104 which maps, for example, an 8 bit symbol to an n-bit symbol, and a pulse shaper 106 in the form of a k-times oversampling filter. The output bit rate Fo is related to the input bit rate Fi by equation 2 as follows:

$$Fo = Fi^*((N+R)/R)^*(8/n)^*k. \qquad \text{Eq.(2)}$$

In one implementation for the digital video broadcast (DVB) European Telecommunications Standard (ETS) 300429 (discussed in more detail later), Fo=Fi*(272/47). In order to provide the correct output timing, the encoder circuitry has to be clocked with a clock signal which has a frequency (272/47) times higher than the input rate Fi. Since the value (272/47) is a non-integer value, then using a PLL 108 to generate the clock signal from the input signal requires a high multiplication factor of 272. For the same reasons as those discussed previously, such a multiplication factor results in a high degree of jitter, and makes the PLL 108 very difficult to integrate into an integrated circuit.

In similar manner to that described previously, it is possible to use a conventional NCO to generate the clock signal. However, there are no suitable integer values of STEP and $2^m$ which satisfy the frequency relation of (272/47). Therefore, if a conventional NCO is used, it is necessary to dynamically vary the value of STEP to try to approximate the desired frequency relation.

It would be desirable to provide a more flexible interpolation arrangement using an NCO which provides greater flexibility in enabling different frequencies to be matched without having to vary an increment value dynamically.

SUMMARY OF THE INVENTION

The present invention concerns an interpolator generally comprising a fractional interpolator and a numeric controlled oscillator. The numeric controlled oscillator may be configured to generate a control signal for controlling the fractional interpolator. The numeric controlled oscillator may comprise a register, a modulo-M device, and an adder. The register may be configured to hold a count value. The modulo-M device may be configured to apply a modulo-M function to the count value stored in the register, and to generate the control signal therefrom. The adder may be configured to add an increment value to the control signal from the modulo-M device, to update the count value in the register.

The objects, features and advantages of the invention include greater flexibility in enabling different frequencies to be matched, without requiring dynamic correction of an increment value.

BRIEF DESCRIPTION OF THE DRAWINGS

These and other features, advantages and objects of the invention will be become apparent from the following non-limiting description of a preferred embodiment of the invention, and the appended claims and drawings, in which:

DETAILED DESCRIPTION OF THE PREFERRED EMBODIMENTS

Figure 4:
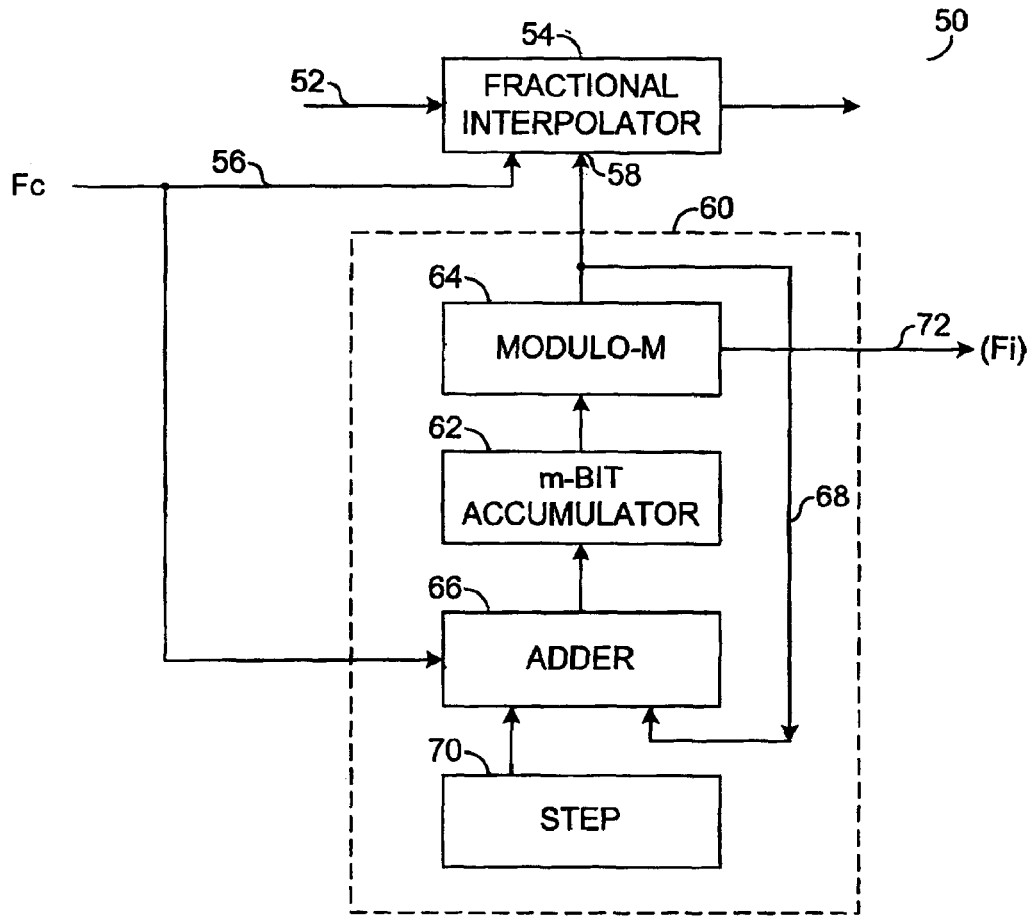
FIG. 4 is a schematic block diagram illustrating a first embodiment of the invention.

FIG. 4 shows the basic building blocks of a signal interpolator in a first embodiment. The purpose of the circuit 50 in this embodiment is to enable the circuit 50 operating from a certain clock frequency (e.g., Fc) to be able to extract and process data related to a different clock frequency (e.g., Fi).

Figure 2:
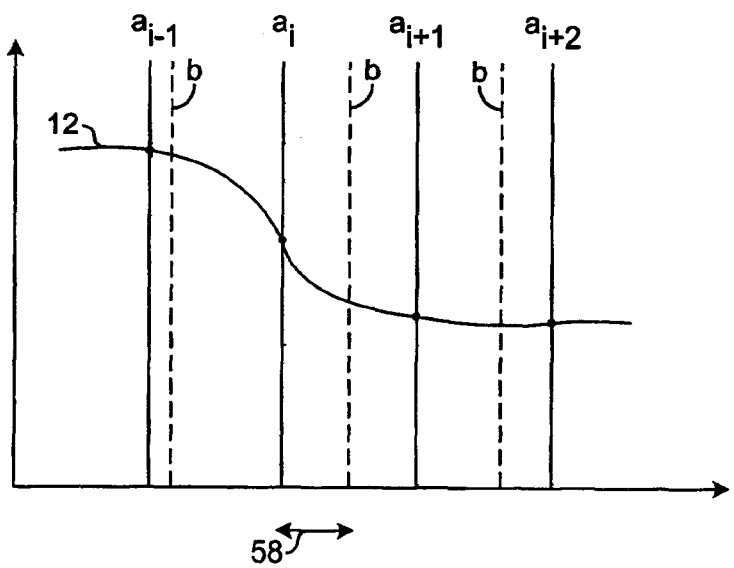
FIG. 2 is a schematic timing diagram for the conventional interpolator of FIG. 1.

The circuit 50 is clocked at the circuit clock frequency Fc, and the circuit receives digitised values of an input signal 52 also sampled using the same circuit clock frequency Fc. The digitised samples are fed to a fractional interpolator 54 for re-calculating (interpolating) the digitised samples according to different timings matched to the clock frequency Fi. The fractional interpolator 54 has a clock signal input 56 for receiving the circuit clock frequency Fc, and a digital control input 58 for controlling the timing at which a new sample is calculated relative to two consecutive samples of the input signal 52. Referring to FIG. 2, the magnitude of the digital control input 58 controls the "time position" for the calculation relative to the "time positions" of two adjacent input samples (e.g., $a_i$ and $a_{i+1}$). A low value of the control input 58 indicates that the interpolation should be carried out close to the earlier ($a_i$) of the two samples, and a high value of the control input 58 indicates that the interpolation should be carried close to the later ($a_{i+1}$) of the two samples. For the purposes of re-sampling, the circuit frequency Fc has to be at least twice as high as the maximum symbol processing frequency given as n×Fi (where n is a small integer not greater than ten).

The signal for the control input 58 is generated by an NCO 60. The NCO 60 includes an m-bit accumulator 62, a modulo-M register 64 coupled to the output of the accumulator 62, and an adder 66. The adder 66 is coupled in a feedback loop 68 from the output of the modulo-M register 64, for incrementing the value stored in the accumulator 62 by a value (e.g., STEP) stored in a register 70. (In this embodiment, the value STEP is stored in a register 70 for the purposes of illustration. However, it will appreciated from later description that the value STEP does not need to be changed dynamically, in contrast to the conventional approaches described above. Therefore, it is possible that the value STEP could be hardwired in an integrated circuit implementation, or built into the adder 66, as a fixed increment.)

Figure 1:
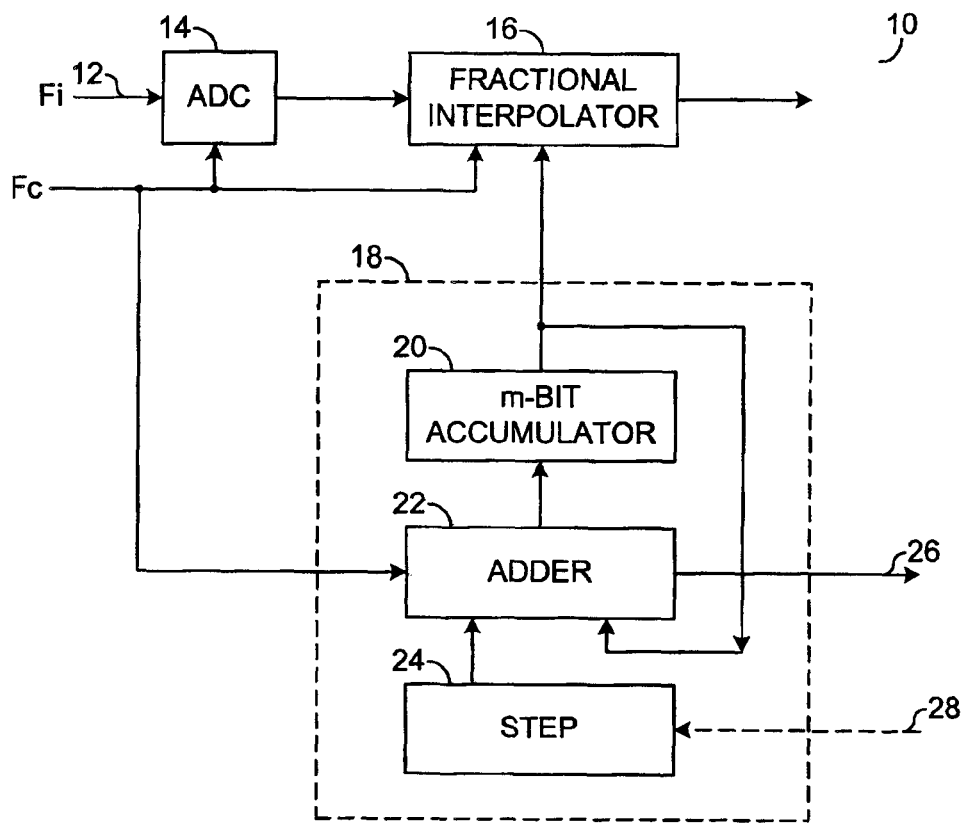
FIG. 1 is a schematic block diagram illustrating a conventional interpolator.

The accumulator 62 is clocked by the circuit clock frequency Fc, so that the value in the accumulator 62 is repeatedly incremented by the value STEP. However, in contrast to the conventional arrangement in FIG. 1, the range of count values is not $2^m$, but is instead limited only by the value of M for the modulo-M register 64. For example, the modulo-M register may permit values from zero to (M−1), providing an overall modulus of the count range of M. The value M can be any (integer) value, including even numbers, odd numbers, and prime numbers. This significantly broadens the relationship between the repetition frequency of the NCO 60 and the circuit clock frequency Fc, which is now determined by equation 3 as follows:

$$F_{NCO} = Fc \times STEP/M \qquad \text{Eq.(3)}$$

It will be appreciated that the number of bits m in the accumulator 62 should be sufficient to accommodate at least the value M for the modulo-M register 64. However, the number of bits m no longer directly defines the frequency of the NCO 60. The numbers m and M together affect the granularity of the virtual time scale for the fractional interpolation, and therefore generally introduce a quantization in time (in addition to the amplitude quantization introduced by digital sampling of the input signal). The number of bits m may be chosen to keep this timing error small. However, the number of bits m will typically be balanced to be not too great, as a large number of bits m would increase the complexity of the implementation, especially in the fractional interpolator 54.

An overflow output 72 from the modulo-M register 64 provides a signal at each period of the NCO output, indicating that one sample period at the clock frequency Fi has elapsed. This signal is fed to downstream circuits (not shown) to control timing aligned to the clock frequency Fi.

Using a modulo-M count enables the NCO 60 to be used to generate a much wider range of frequencies, relative to the circuit clock frequency Fc, using a fixed value of STEP.

By using a fixed value of STEP, no feedback control signal "corrects" the value dynamically, and the NCO may therefore be much less prone to jitter.

In this embodiment, the modulo-M register 64 is shown as a separate unit from the accumulator 62. However, it will be appreciated that, in an integrated circuit implementation, the modulo-M function may be incorporated into the accumulator 62, or both the accumulator 62 and the modulo-M function may be incorporated into the adder 66. However, a feature of the embodiment would still remain that the NCO timing may be governed by a modulo value M which can be any integer, and may not be defined only by the number of bits m in the accumulator 62 or in the adder 66.

In one form, the fractional interpolator 54 may be an ideal sin(x)/x filter, to provide proper re-sampling at a different frequency. However, for practical realization, a small number of taps can be used. The structure of the fractional interpolator 54 is a Finite Impulse Response (FIR) filter which has a selectable set of coefficients. The selection may be controlled by the interpolator control input 58. The coefficients may either be standard, pre-calculated values, or they may be calculated to suit the particular implementation.

Practical trials show that a completely different approach for the fractional interpolator 54 may also be used, based on polynomial interpolation (for example, cubic polynomial interpolation). This can result in very low complexity, yet still achieve excellent results in terms of spectral characteristics. Further information may be found in "Interpolation in Digital Modems—Part II: Implementation and Performance", Lars Erup and Floyd M. Gardner, IEEE Transactions on Communications, Vol. 41, No. 6, June 1993 hereby incorporated by reference in its entirety.

Figure 5:
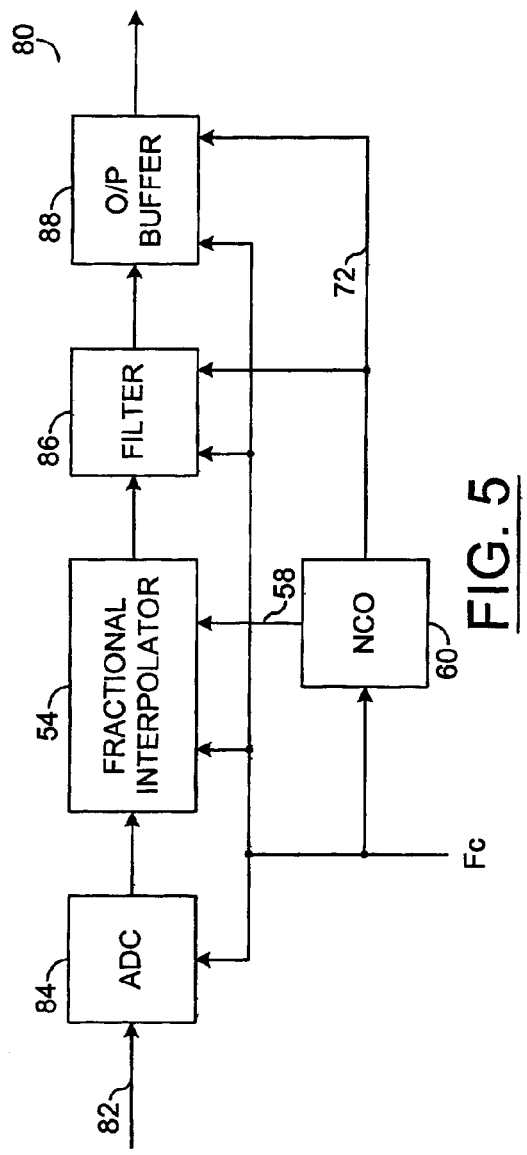
FIG. 5 is a schematic block diagram illustrating a second embodiment of the invention in the form of a GSM/TD-SCDMA receiver.

Referring to FIG. 5, a second embodiment, in the form of a combined GSM/TD-SCDMA receiver channel 80, is shown incorporating the circuit of the first embodiment. The receiver channel 80 comprises a receiver input 82, an ADC 84, the fractional interpolator 54, the NCO 60, a filter arrangement 86 and an output buffer 88 for feeding to a digital signal processor (not shown).

Apart from the fractional interpolator 54 and the NCO 60, the receiver channel 80 is based on a conventional GSM receiver, and all of the circuit elements are driven by a clock signal of k×13 MHz (where k may be a small integer), suited to GSM signals, and which would typically be used to drive a conventional GSM circuit. In this embodiment, for TD-SCDMA signals, the NCO 60 generates suitable timing for interpolation of the sampled signals to a n×10.24 MHz clock (where n may be a small integer), without requiring the circuit clock frequency to be changed. The overflow output 72 from the NCO 60 provides an enable signal to the downstream circuitry, synchronised to the n×10.24 clock timing.

Based on the above expression (2) for the NCO 60, a ratio of the value STEP to the value M may be expressed by equation 4 as follows:

$$\frac{STEP}{M} = \frac{n \times 10.24 \text{ MHz}}{k \times 13 \text{ MHz}} \qquad \text{Eq. (4)}$$

Since the value 13 is a prime number, then the value M must also contain the factor 13. An example implementation might be:

$M=13\times4\times100=5200$ $k=4$ $n=2$ $STEP=(2\times10.24)/(4\times13)*5200=2048.$ In order to accommodate a value of M=5200, then the number of bits m in the accumulator should be at least 13.

Such a device would be clocked at the GSM circuit frequency of k×13 MHz (=52 MHz), and the signal processing chain would work effectively at the desired TD-SCDMA timing defined by the NCO 60, of n×10.24 MHz (=20.48 MHz). Such an arrangement illustrates how a conventional digital GSM receiver channel can be modified to operate also at the TD-SCDMA standard to provide compatibility for both standards. Moreover, even though the two frequencies are incompatible for using a conventional NCO, the NCO 60 of the first embodiment enables the correct clock timing to be generated from a fixed value of STEP, without the need for any feedback control loop for correcting the value STEP dynamically.

Figure 6:
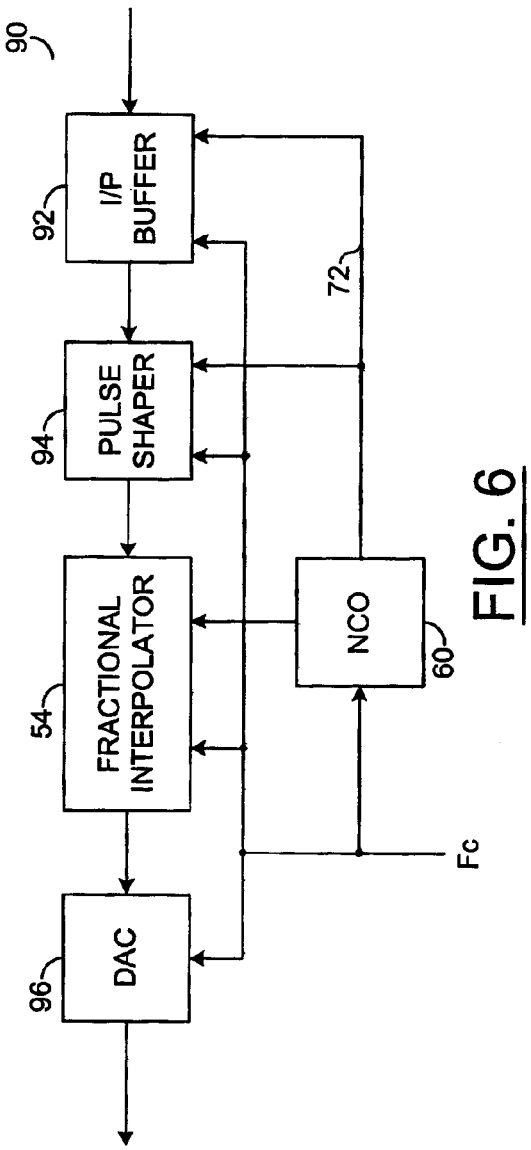
FIG. 6 is a schematic block diagram illustrating a third embodiment in the form of a GSM/TD-SCDMA transmitter.

FIG. 6 shows an equivalent transmitter channel 90 using similar principles to FIGS. 4 and 5. The transmitter channel 90 includes an input buffer 92, a pulse shaper 94, the fractional interpolator 54, the NCO 60, and an output DAC 96. As in the receiver channel 80 of FIG. 5, all devices may be driven with a k×13 MHz clock for direct compatibility with the GSM standard, and enabling standard GSM circuitry to be used. For TD-SCDMA transmission, the transmitter chain may produce samples for the n×10.24 MHz domain, and the interpolator functions to calculate the resulting samples in the k×13 MHz domain. The input buffer 92 and the pulse shaper 94 receive an enable signal from the NCO 60 which keeps the effective sampling rate at n×10.24 MHz in these devices.

Like any up-sampling without low-pass filtering, the sample rate conversion by the fractional interpolator 54 from n×10.24 MHz to the higher k×13 MHz may produce images of the desired band. It is preferably the function of the fractional interpolator 54 to suppress such images. It is assumed that the transmitter channel 90 may operate with 4× or 8× oversampling in the n×10.24 MHz domain, and this relaxes the task of suppressing images, and enables the interpolator design to be kept relatively simple.

Figure 7:
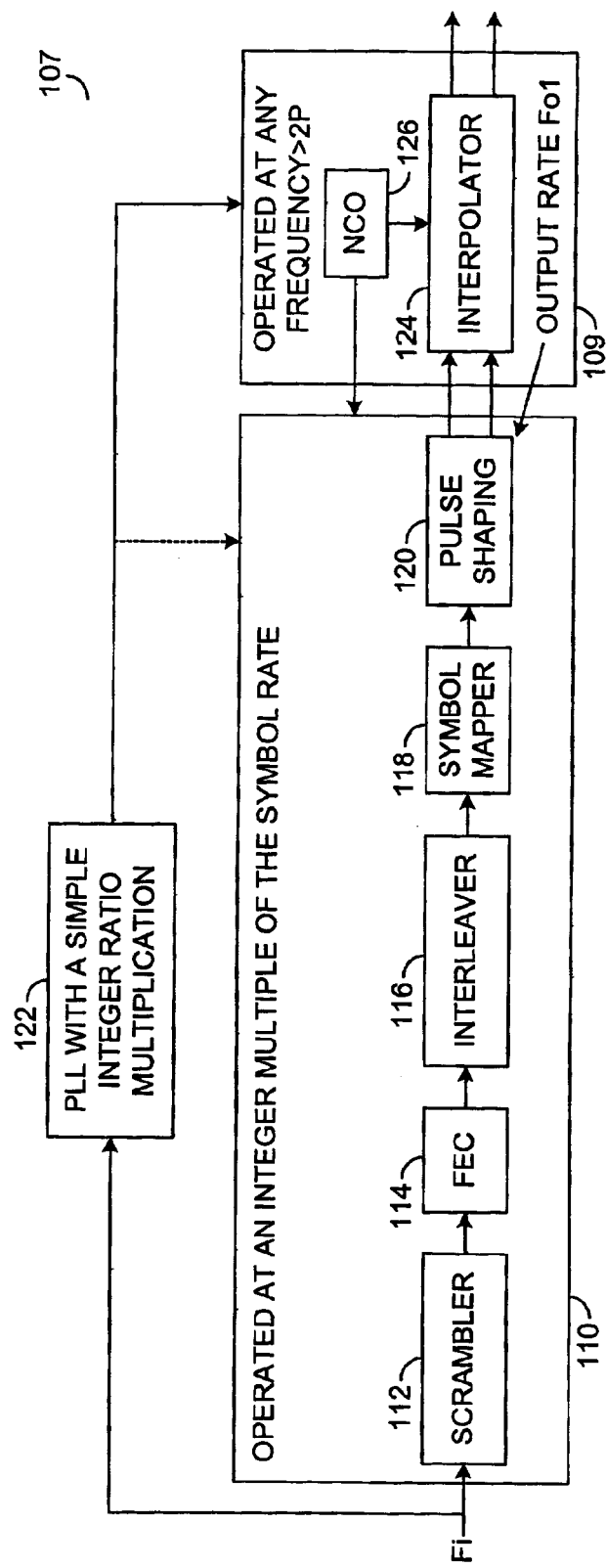
FIG. 7 is a schematic block diagram showing a fourth embodiment in the form of a QAM encoder.

FIG. 7 shows a further embodiment of the invention in the form of a QAM encoder 107. The present embodiment is configured for QAM 64 encoding for the DVB European Telecommunications Standard (ETS) 300429, hereby incorporated by reference in its entirey.

The QAM encoder 107 generally comprises encoder circuitry 110, a PLL 122 and a circuit 109. The circuit 109 generally comprises an interpolator 124 and an NCO 126. The circuitry 110 generally comprises an input scrambler 112, an FEC block 114, an interleaver 116, a symbol mapper 118, and a pulse shaper 120. The blocks of the circuit 110 which change the bit rate at each part of the circuit are the FEC block 114, the symbol mapper 118 and the pulse shaper 120. The FEC block 114 performs Reed Soloman redundancy coding to add R redundant bytes for every S bytes. The symbol mapper 118 maps typically 8-bit symbols to p-bit quadrature output symbols (represented by the parallel output channels). The pulse shaper 120 is a q-times oversampling filter (two-channel for the quadrature output symbols).

The output bit rate Fo1 in each output channel may be related to the input bit rate Fi as expressed by equation 5 as follows:

$$Fo1=Fi*((S+R)/R)*(8/p)*q \qquad \text{Eq.(5)}$$

For a DVB ETS 300429 implementation, the FEC block 114 performs RS 188, 204 coding, so that S=188 and R=16.

The value p may be 6 bits per symbol. The value of q is typically 4, for a four-times oversampled output.

These values result in Fo1=Fi*(272/47).

As explained with reference to FIG. 3, a timing clock of (272/47) times the input frequency is generally needed for the correct output timing. Were a PLL to be employed to generate this clock frequency directly, then this would require a multiplication factor of 272 in the PLL. Moreover, for a typical 7 Msymbols/second, the PLL reference frequency would be only 25.7 kHz. This extraordinarily low reference frequency and high multiplication factor results from the fact that the output rate Fo1 may not be an integer multiple of the input rate Fi.

Therefore, the present embodiment uses the same principles as the previous embodiments, to enable the circuit to be clocked with a clock frequency which is more convenient, but which is not itself aligned with the desired output timing. This circuit clock frequency is derived from a PLL 122, which operates at a relatively low integer multiple of the input rate Fi. Typically, the PLL 122 may be configured to operate at up to 64 times the input rate Fi.

In order to match the output to the correct timing of 272/47 times the input rate Fi, the fractional interpolator 124, driven by the NCO 126 with a modulo-M function, may be used. The NCO 126 also provides an overflow signal 128 (similar to the signal 72 of the previous embodiments) for controlling the timing of circuits requiring the 272/47*Fi timing.

In order to satisfy the sampling, the output from the PLL 122 should be at least twice Fo1, (e.g, at least 2*(272/47)*Fi). In the present embodiment, the PLL output is 12*Fi.

In order to match the correct output timing, values of STEP and M for the modulo-M NCO 126 may be chosen as determined by equation 6 as follows:

$$F_{NCO}=(12*Fi)*STEP/M=(272/47)*Fi \qquad \text{Eq.(6)}$$

Therefore, STEP/M=272/(47*12).

Suitable values of STEP and M are therefore 272 and 47*12, respectively.

Although the circuitry 110 is shown as being clocked at the same rate as the interpolator 124 and the NCO 126 (e.g., at 12*Fi), it will be appreciated that the circuitry 110 could be clocked at any integer multiple of the symbol rate (at the output of the symbol mapper 118) which may be different from that used for the interpolator 124 and the NCO 126.

Figure 3:
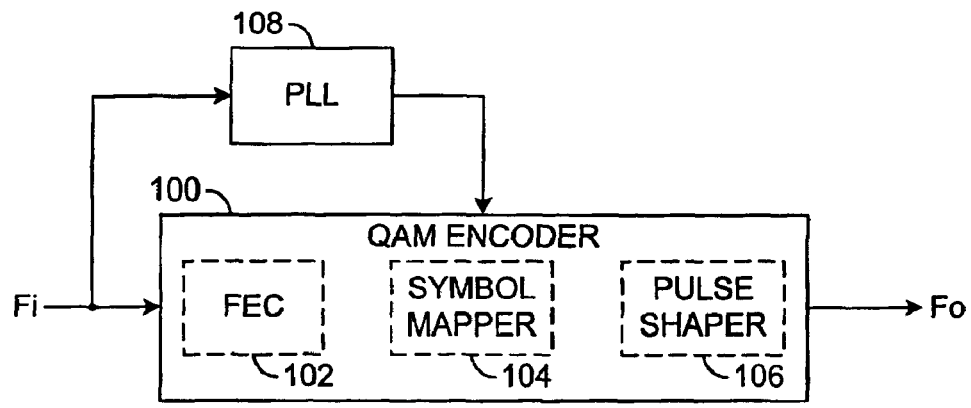
FIG. 3 is a schematic block diagram showing a conventional approach to a QAM encoder.

The above embodiment requires additional circuitry compared to the conventional arrangement shown in FIG. 3. However, the circuit can avoid the problems associated with a high multiplying PLL, and is substantially simpler to incorporate into an integrated circuit.

It will further be appreciated that the foregoing description is merely illustrative of preferred forms of the invention, and that many modifications and equivalents may be used within the scope of the invention. Accordingly, the appended claims are to be construed to cover all such modifications and equivalents.

What is claimed is:

1. A signal interpolator comprising:
    a fractional interpolator; and
    a numeric controlled oscillator for generating a control signal for controlling said fractional interpolator, said numeric controlled oscillator comprising:
        a register for holding a count value;
        a modulo-M device for applying a modulo-M function to said count value stored in said register, and generating said control signal therefrom; and
        an adder for adding an increment value to said control signal from said modulo-M device, for updating said count value in said register.

2. The signal interpolator according to claim 1, wherein said adder is configured to add a value STEP to said signal from said modulo-M device, said value STEP being an integer greater than zero.

3. The signal interpolator according to claim 1, wherein said modulo-M device comprises an overflow signal generator configured to generate an overflow signal when said count value inputted to said modulo-M device overflows said modulo-M function.

4. The signal interpolator according to claim 1, wherein a value M of said modulo-M device is an integer other than an integer power of two.

5. The signal interpolator according to claim 4, wherein said value M is an odd number.

6. The signal interpolator according to claim 1, wherein said signal interpolator is implemented in digital form in an integrated circuit.

7. A digital signal interpolator for converting a first signal comprising digital samples synchronised to a first clock frequency, to a second signal synchronised to a second clock frequency, said signal interpolator comprising:
    a fractional interpolator for receiving said digital samples of said first signal synchronised to said first clock frequency; and
    a numeric controlled oscillator for generating a control signal for controlling said fractional interpolator, said numeric controlled oscillator comprising:
        a modulo-M counter driven by a counter clock frequency being one of said first and said second clock frequencies, said modulo-M counter being configured to (i) repeatedly count through a sequence of count values in a count range of modulus M, where the value M is an integer other than a power of 2, and (ii) generate a modulo-M signal as said control signal for controlling said fractional interpolator.

8. The digital signal interpolator according to claim 7, wherein the numeric controlled oscillator further comprises:
    a period signal generator configured to generate a period signal each time said count value overflows said value M periodically, said period signal being synchronised to one of said first and second clock frequencies other than said counter clock frequency.

9. The digital signal interpolator according to claim 7, wherein said counter clock frequency for said modulo-M counter is said first clock frequency to which said first signal is synchronised.

10. The digital signal interpolator according to claim 9, wherein said numeric controlled oscillator further comprises:
    a period signal generator configured to generate a period signal each time said count value overflows said value M periodically, said period signal being synchronised to said second clock frequency.

11. The digital signal interpolator according to claim 7, wherein said counter clock frequency for said modulo-M counter is said second clock frequency.

12. The digital signal interpolator according to claim 11, wherein said numeric controlled oscillator further comprises:
    a period signal generator configured to generate a period signal each time said count value overflows said value M periodically, said period signal being synchronised to said first clock frequency.

13. The digital signal interpolator according to claim 7, wherein said modulo-M counter comprises:

a register for holding a count value;

a modulo-M device for applying a modulo-M function to said count value stored in said register; and an adder for adding an increment value to an output from said modulo-M device, for updating said count value in said register.

14. The digital signal interpolator according to claim 13, wherein said increment value is a value greater than zero.

15. The digital signal interpolator according to claim 7, wherein one of said first and said second frequencies is k×13 MHz, where k is an integer between 1 and 10 inclusive.

16. The digital signal interpolator according to claim 7, wherein one of said first and said second clock frequencies is n×10.24 MHz, where n is an integer between 1 and 10 inclusive.

17. The digital signal interpolator according to claim 7, wherein said interpolator is incorporated in a quadrature amplitude modulation circuit for adjusting an output timing of said quadrature amplitude modulation circuit.

18. The digital signal interpolator according to claim 7, wherein said digital signal interpolator is implemented in an integrated circuit.

19. A signal interpolator comprising:

means for performing fractional interpolator in response to a control signal;

means for applying a modulo-M function to a count value for generating said control signal therefrom; and means for adding an increment value to said control signal for updating said count value.

20. A digital signal interpolator for converting a first signal comprising digital samples synchronised to a first clock frequency, to a second signal synchronised to a second clock frequency, said signal interpolator comprising:

means for receiving said digital samples of said first signal synchronised to said first frequency and for performing fractional interpolation thereon according to a control signal; and means for counting driven by a counter clock frequency being one of said first and said second clock frequencies, and configured to (i) repeatedly count through a sequence of count values in a count range of modulus M, where the value M is an integer other than a power of 2, and (ii) generate a modulo-M signal as said control signal.

21. A method of interpolating a signal comprising the steps of:

(A) holding a count value;

(B) generating a control signal in response to applying a modulo-M function to said count value;

(C) generating a second signal in response to adding an increment value to said control signal;

(D) updating said count value with said second signal; and (E) fractional interpolating said signal in response to said control signal.

* * * * *